(12) United States Patent
Teranishi et al.

(10) Patent No.: US 12,082,376 B2
(45) Date of Patent: Sep. 3, 2024

(54) ELECTRONIC CONTROL DEVICE

(71) Applicant: Hitachi Astemo, Ltd., Hitachinaka (JP)

(72) Inventors: Minami Teranishi, Tokyo (JP); Shinya Kawakita, Hitachinaka (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 223 days.

(21) Appl. No.: 17/794,479

(22) PCT Filed: Dec. 11, 2020

(86) PCT No.: PCT/JP2020/046392
§ 371 (c)(1),
(2) Date: Jul. 21, 2022

(87) PCT Pub. No.: WO2021/149393
PCT Pub. Date: Jul. 29, 2021

(65) Prior Publication Data
US 2023/0069331 A1  Mar. 2, 2023

(30) Foreign Application Priority Data
Jan. 22, 2020  (JP) .................................. 2020-008785

(51) Int. Cl.
*G06F 1/16* (2006.01)
*H05K 5/00* (2006.01)
(Continued)

(52) U.S. Cl.
CPC ................................ *H05K 7/20409* (2013.01)

(58) Field of Classification Search
CPC ........... H05K 7/20409; H05K 7/20418; H05K 7/20427; H05K 7/2039; H05K 7/20436;
(Continued)

(56) References Cited

U.S. PATENT DOCUMENTS 5,030,793 A * 7/1991 McCarthy ............ H05K 9/0041
333/81 B
6,122,167 A * 9/2000 Smith .................... H01L 23/427
361/688
(Continued)

FOREIGN PATENT DOCUMENTS

EP  2 175 708 A1  4/2010
JP  2010-256619 A  11/2010
(Continued)

OTHER PUBLICATIONS

International Search Report with English Translation and Written Opinion in PCT/JP2020/046392 dated Feb. 22, 2021.

*Primary Examiner* — Anthony M Haughton
(74) *Attorney, Agent, or Firm* — Foley & Lardner LLP

(57) ABSTRACT

An electronic control device includes an enclosure including a first enclosure having an assembly opening and a second enclosure covering the entire assembly opening, the enclosure having a communication opening communicating with the assembly opening; a circuit board accommodated in the enclosure; an integrated circuit element mounted on the circuit board; and a heat dissipating shield member thermally coupled to the integrated circuit element and grounded, wherein the heat dissipating shield member includes an inner portion accommodated inside the enclosure and thermally coupled to the integrated circuit element and an outer portion extending to an outside of the enclosure via the communication opening.

12 Claims, 11 Drawing Sheets

(51) Int. Cl.
*H05K 7/00* (2006.01)
*H05K 7/20* (2006.01)

(58) Field of Classification Search
CPC . H05K 7/20445; H05K 7/20454; H05K 7/205
See application file for complete search history.

(56) References Cited

U.S. PATENT DOCUMENTS

| | | | |
|---|---|---|---|
| 6,262,363 B1 * | 7/2001 | Bortolini | H05K 9/0015 361/752 |
| 9,913,361 B2 * | 3/2018 | Barron | H05K 3/30 |
| 10,779,391 B2 * | 9/2020 | Barron | H05K 1/0204 |
| 2007/0015416 A1 * | 1/2007 | Gutierrez | H01R 24/64 439/676 |
| 2014/0268578 A1 * | 9/2014 | Dolci | H05K 7/20436 361/721 |
| 2015/0115424 A1 | 4/2015 | Riviere et al. | |
| 2015/0340325 A1 | 11/2015 | Saito et al. | |
| 2018/0150906 A1 * | 5/2018 | Aldineh | G06Q 30/08 |
| 2019/0043779 A1 | 2/2019 | Chung et al. | |
| 2021/0175145 A1 | 6/2021 | Teranishi et al. | |
| 2022/0221667 A1 * | 7/2022 | Yao | G02B 6/4269 |

FOREIGN PATENT DOCUMENTS

| | | |
|---|---|---|
| JP | 2019-106432 A | 6/2019 |
| WO | WO-2014/064806 A1 | 5/2014 |

\* cited by examiner (a)

(b)

ELECTRONIC CONTROL DEVICE

TECHNICAL FIELD

The present invention relates to an electronic control device.

BACKGROUND ART

An electronic control device used for in-vehicle use or the like is miniaturized and improved in performance, and the amount of heat generation and radio frequency noise tend to increase. In recent years, an operating frequency has increased from a MHz band to a GHz band, and accordingly, communication between an electronic control device and an external device has also increased. The increase in operating frequency requires the electronic control device to have greater cooling performance. In addition, an increase in communication speed requires further suppression of intrusion of electromagnetic radiation to the outside and electromagnetic noise from the outside.

As an electronic module in which a heat generating electric component is accommodated in a housing, there is known a structure in which a heat sink is bonded to a heat generating electric component mounted on a print circuit board via a heat conductive material, and a fin of the heat sink protrudes to the outside from an opening provided in an upper face of the housing. This electronic module has a structure in which the conductive base to which the print circuit board is fixed is exposed from the housing on the lower face opposite to the fin (see, for example, PTL 1).

CITATION LIST

Patent Literature

PTL 1: EP 02175708 A

SUMMARY OF INVENTION

Technical Problem

Since the electronic module described in PTL 1 has a structure in which the conductive base for fixing the print circuit board is exposed from the housing, it is not possible to sufficiently suppress the intrusion of electromagnetic radiation to the outside and electromagnetic noise from the outside.

Solution to Problem

An electronic control device according to an aspect of the present invention includes an enclosure including a first enclosure having an assembly opening and a second enclosure covering the entire assembly opening, the enclosure having a communication opening communicating with the assembly opening, a circuit board accommodated in the enclosure, an integrated circuit element mounted on the circuit board, and a heat dissipating shield member thermally coupled to the integrated circuit element and grounded, wherein the heat dissipating shield member includes an inner portion accommodated inside the enclosure and thermally coupled to the integrated circuit element and an outer portion extending to an outside of the enclosure via the communication opening.

Advantageous Effects of Invention

According to the present invention, there is provided an electronic control device which has high cooling performance and can suppress intrusion of electromagnetic radiation to the outside and electromagnetic noise from the outside.

DESCRIPTION OF EMBODIMENTS

Figure 1:
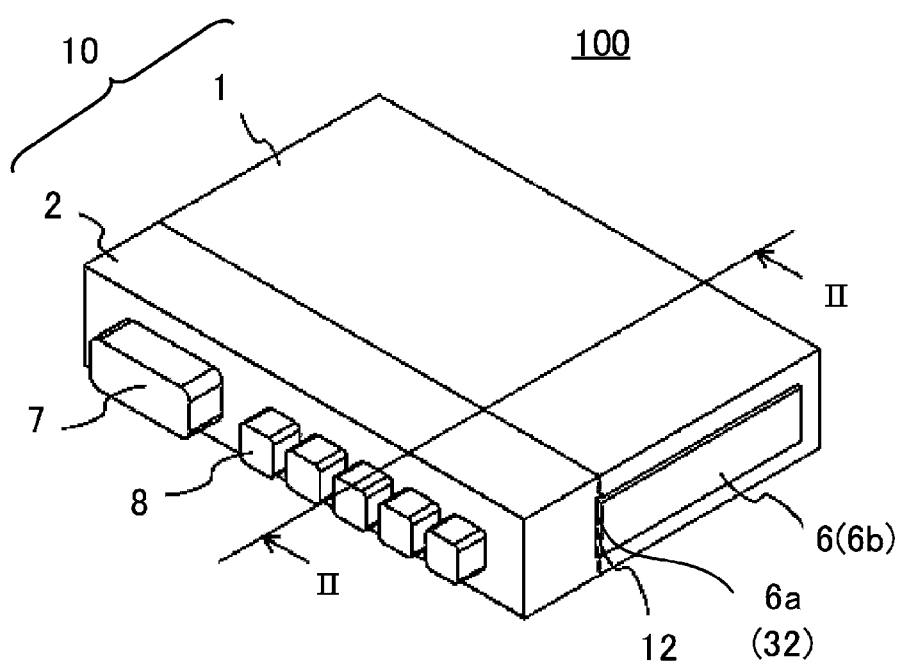
FIG. 1 is an external perspective view of a first embodiment of an electronic control device of the present invention.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

First Embodiment

Hereinafter, a first embodiment of the present invention will be described with reference to FIGS. 1 to 4.

Figure 2:
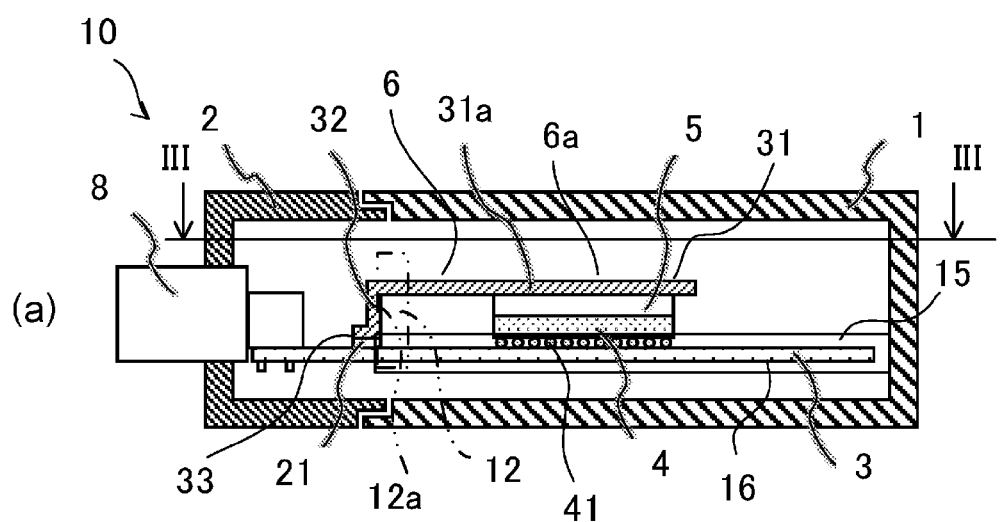
FIG. 2(a) is a cross-sectional view of the electronic control device illustrated in FIG. 1 taken along line II-II.
FIG. 2(b) is a side view of a peripheral edge portion of a communication opening of an enclosure.
Figure 2:
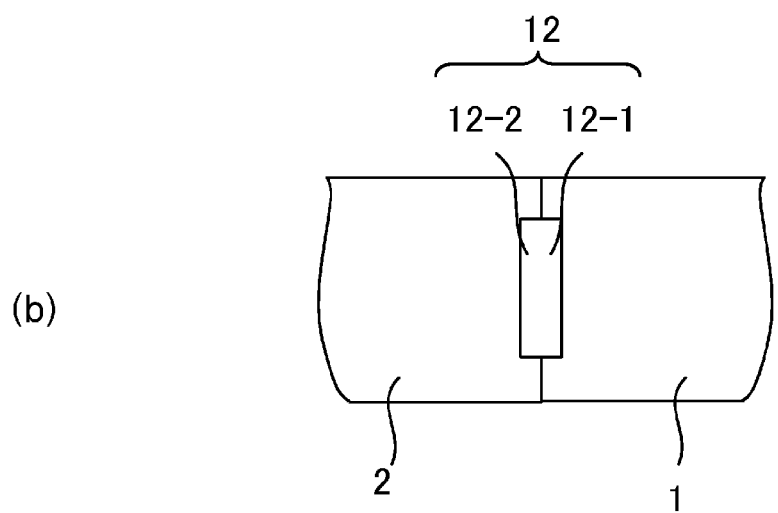
Figure 3:
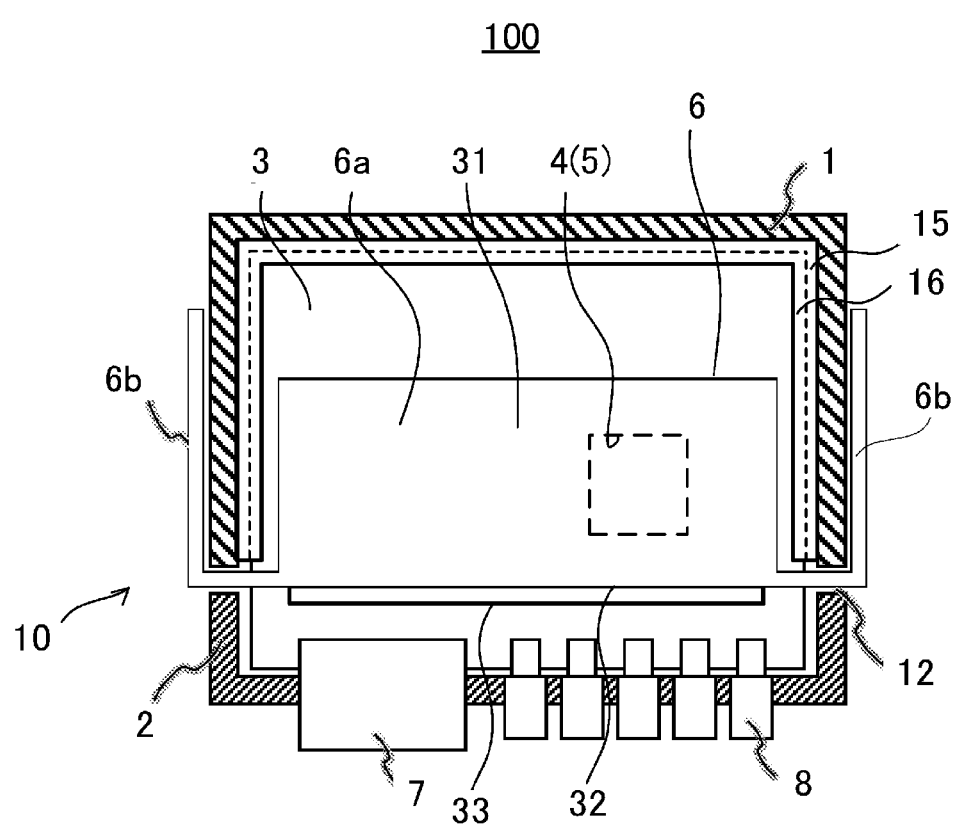
FIG. 3 is a cross-sectional view of the electronic control device illustrated in FIG. 2(a) taken along line III-III.
Figure 4:
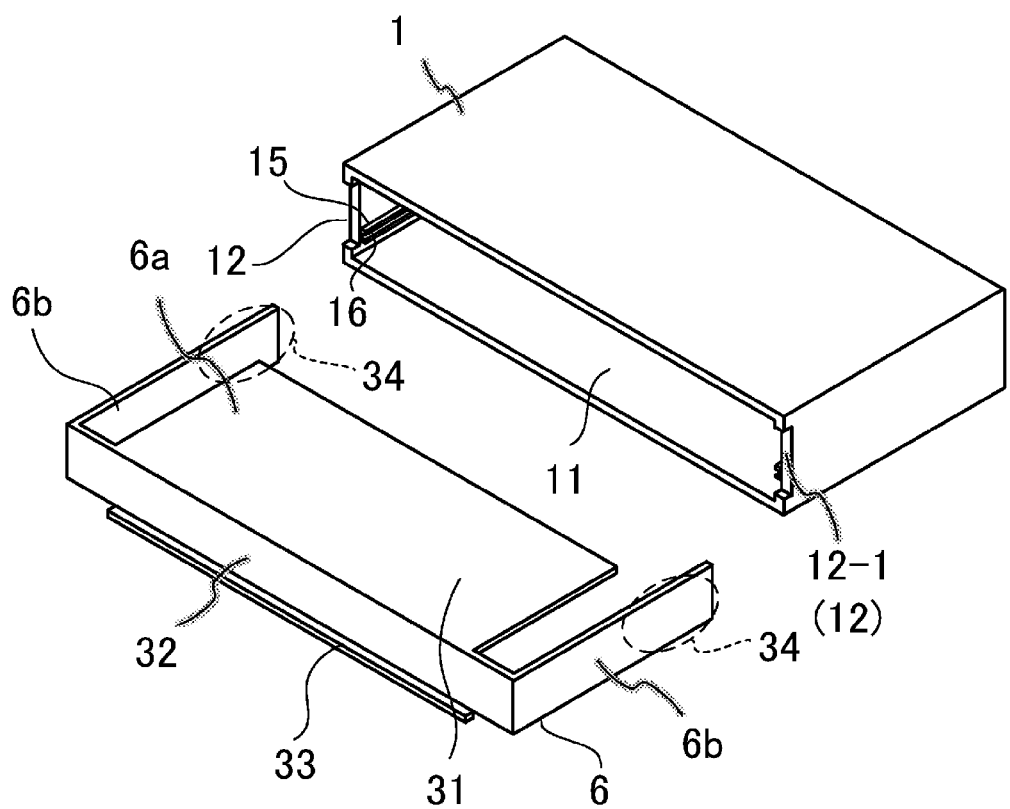
FIG. 4 is an exploded perspective view of the first enclosure and the heat dissipating shield member illustrated in FIG. 2(a).

FIG. 1 is an external perspective view of an electronic control device of the present invention, FIG. 2(a) is a cross-sectional view of the electronic control device illustrated in FIG. 1 taken along line II-II, FIG. 2(b) is a side view of a peripheral edge portion of a communication opening of an enclosure, and FIG. 3 is a cross-sectional view of the electronic control device illustrated in FIG. 2(a) taken along line III-III. FIG. 4 is an exploded perspective view of a first enclosure and a heat dissipating shield member illustrated in FIG. 2(a).

An electronic control device 100 includes an enclosure 10 including a first enclosure 1 and a second enclosure 2, a heat dissipating shield member 6, a circuit board 3, an integrated circuit element 4, a connector 7, and an ethernet terminal 8. As illustrated in FIG. 1, the first enclosure 1 is disposed on the rear side of the second enclosure 2, and the first enclosure 1 and the second enclosure 2 are assembled in the same layer, that is, on the same plane. The first enclosure 1 has an assembly opening 11 (see FIG. 4) facing the second enclosure 2, in other words, at the front face. The second enclosure 2 is disposed at the front portion of the enclosure 10, and has an opening at its rear having the same size as the assembly opening 11 of the first enclosure 1. As shown in FIG. 2, the first enclosure 1 and the second enclosure 2 are assembled by fitting a peripheral edge portion, of the assembly opening 11 of the first enclosure 1, toward the front face and a peripheral edge portion, of the opening of the second enclosure 2, toward the rear face.

The first enclosure 1 and the second enclosure 2 are fixed by, for example, snap-fitting in which one of the first enclosure 1 and the second enclosure 2 has an engaging piece and the other has a locking portion for locking the engaging piece. The first enclosure 1 and the second enclosure 2 may be assembled by a fastening member such as a screw or a bolt instead of the snap-fit.

By assembling the first enclosure 1 and the second enclosure 2, the entire assembly opening 11 of the first enclosure 1 is covered with the second enclosure 2, and an internal space of the enclosure 10 is formed.

As shown in FIGS. 1 and 2, the upper face and the lower face of the first enclosure 1 and the second enclosure 2 are flat faces, and these faces are disposed in parallel. In order to improve the heat dissipation performance of the electronic control device 100, the first enclosure 1 and/or the second enclosure 2 each may have a heat dissipation fin or the like.

As illustrated in FIG. 2, the circuit board 3 and the integrated circuit element 4 are accommodated in the enclosure 10. One or a plurality of connectors 7 and a plurality of Ethernet (registered trademark) terminals 8 are mounted on the circuit board 3 by soldering. The connector 7 and the Ethernet terminal 8 are inserted into an opening formed in the second enclosure 2 in a state of being mounted on the circuit board 3, and protrude from the front face of the second enclosure 2 to the outside.

The integrated circuit element 4 is mounted on the circuit board 3 by a bonding material 41 (see FIG. 2) such as solder.

The heat dissipating shield member 6 is disposed on the integrated circuit element 4. A heat transfer portion 5 for improving heat conduction between the integrated circuit element 4 and the heat dissipating shield member 6 is interposed between the heat dissipating shield member 6 and the integrated circuit element 4, and the integrated circuit element 4 and the heat dissipating shield member 6 are thermally coupled.

The heat dissipating shield member 6 thermally coupled to the integrated circuit element 4 is exposed to the outside of the enclosure 10 through communication openings 12 (see FIGS. 2(b), 3, and 4) formed in the left and right side portions of the first enclosure 1 and the second enclosure 2. The structure, operation, and the like of the heat dissipating shield member 6 will be described later.

The first enclosure 1 is formed of a resin material excellent in moldability and weight reduction, such as polybutylene terephthalate (PBT) (for example, a resin containing a conductive filler). The first enclosure 1 can be formed of a sheet metal such as iron or a metal material having excellent thermal conductivity such as aluminum or the ADC 12, which is an aluminum alloy to improve durability and heat dissipation performance. The first enclosure 1 has a rear portion, a left side portion and a right side portion adjacent to the rear portion, a ceiling portion, and a bottom portion, and is formed in a box shape in which the assembly opening 11 is provided at a front face. As illustrated in FIGS. 2 to 4, a board guide portion 15 protruding inside of the first enclosure 1 is provided on the inner face of each of the rear portion and the left and right side portions of the first enclosure 1. Referring to FIG. 3, the board guide portion 15 has a U-shape in plan view.

The board guide portion 15 is provided between the ceiling portion and the bottom portion of the first enclosure 1 along the inner faces of the rear portion and the left and right side portions. As illustrated in FIG. 4, the board guide portion 15 has a groove 16 formed at a predetermined depth from the inner side face toward the outer side face. The left and right end portions and the rear end portion of the circuit board 3 are fitted into the groove 16 of the board guide portion 15 and held in the enclosure 10.

In order to attach the circuit board 3 to the groove 16 of the board guide portion 15, the integrated circuit element 4, the heat dissipating shield member 6, the connector 7, and the Ethernet terminal 8 are mounted on the circuit board 3 in advance. Then, in a state where the connector 7 and the Ethernet terminal 8 are inserted into the opening of the second enclosure 2, the left and right end portions of the circuit board 3 are fitted into the groove 16 and are slid toward the rear portion. As a result, the circuit board 3 is held in the groove 16 of the board guide portion 15. When a location at which the rear end face of the circuit board 3 is brought into contact with the bottom face of the groove 16 of the board guide portion 15 located at the rear portion of the first enclosure 1 is set to the arrangement position of the circuit board 3, assembly workability is efficient.

Before the circuit board 3 is fitted into the groove 16, the connector 7 and the Ethernet terminal 8 may be fixed to the second enclosure 2. In this way, during the work of attaching the circuit board 3 in the groove 16, the second enclosure 2 is not displaced from the circuit board 3 on which the connector 7 and the Ethernet terminal 8 are mounted, and the assembly is further facilitated. However, this assembling method is an example, and the present invention is not limited thereto.

As in the first enclosure 1, the second enclosure 2 is formed of a resin material excellent in moldability and weight reduction, such as PBT. As in the first enclosure 1, the second enclosure 2 can be formed of a sheet metal such as iron or a metal material having excellent thermal conductivity such as aluminum or the ADC 12 to improve durability and heat dissipation performance.

As shown in FIG. 2, the second enclosure 2 has a front portion (a left side portion in FIG. 2), a left side portion and a right side portion adjacent to the front portion, a ceiling portion, and a bottom portion. The second enclosure 2 is formed in a box shape in which an opening having the same size as the assembly opening 11 of the first enclosure 1 is provided at the rear portion of the second enclosure 2, in other words, facing the first enclosure 1.

Referring to FIG. 2(b), rectangular cutout recesses 12-1 and 12-2 are formed at each of the left and right side portions of the abutting portion between the front face portion of the first enclosure 1 and the rear face portion of the second enclosure 2, and a communication opening 12 opened to the outside of the enclosure is provided by the rectangular cutout recesses 12-1 and 12-2. That is, the rectangular cutout recess 12-1, which is the rear portion (the right side in FIG. 2) of the communication opening 12, is provided at the front portion of the first enclosure 1, the rectangular cutout recess 12-2, which is the front portion (the left side in FIG. 2) of the communication opening 12, is provided at the rear portion of the second enclosure 2, and one communication opening 12 is formed by the rectangular cutout recess 12-1, which is the rear portion, and the rectangular cutout recess 12-2, which is the front portion. The communication opening 12 communicates with the assembly opening 11.

As described above, the second enclosure 2 has at the front face an opening through which the connector 7 and the Ethernet terminal 8 are inserted, and the connector 7 and the Ethernet terminal 8 protrude from the front face of the second enclosure 2 through the opening. The connector 7 and the Ethernet terminal 8 are connected to a wiring pattern (not illustrated) formed on the circuit board 3 to transmit and receive power and a control signal between the outside and the electronic control device 100 via the connector 7 and the Ethernet terminal 8. By fixing the connector 7 and the Ethernet terminal 8 on which the circuit board 3 is mounted to the second enclosure 2 with a fastening member or the like, the connector 7, the Ethernet terminal 8, and the second enclosure 2 can be integrated with the circuit board 3.

Although FIG. 2 illustrates a structure in which one integrated circuit element 4 and one heat dissipating shield member 6 are mounted on the circuit board 3, one or both of the integrated circuit element 4 and the heat dissipating shield member 6 may be mounted on the circuit board 3. Although not illustrated, a passive element such as a capacitor is also mounted on the circuit board 3, and a wiring pattern for connecting these electronic components to the connector 7 and the Ethernet terminal 8 is also formed. The circuit board 3 is formed of, for example, an organic material such as an epoxy resin or a metal material, and is particularly preferably formed of an FR4 material. The circuit board 3 can be a single-layer board or a multilayer board. In addition, the circuit board 3 has a plurality of through holes (not illustrated) and is electrically connected to a ground layer inside the circuit board 3.

The integrated circuit element 4 is, for example, a semiconductor element with heat generation of a flip chip ball grid array (FCBGA) type. The FCBGA includes a semiconductor chip and an interposer board, and has a structure in which the semiconductor chip is flip-chip mounted on the interposer board by a bonding material (not illustrated) such as solder. The bonding material 41 such as a plurality of solder balls is formed on the face, of the interposer board, opposite to the semiconductor chip, and the interposer board, in other words, the integrated circuit element 4 is electrically connected to the circuit board 3 through the bonding material 41.

As shown in FIGS. 2 and 3, the circuit board 3 is provided across the space in the first enclosure 1 and the space in the second enclosure 2 so as to cross the enclosure space in parallel to both faces of the top plate portion of the first enclosure 1 and the bottom portion of the second enclosure 2. An area obtained by projecting the circuit board 3 onto a plane parallel to the bottom plate of the first enclosure 1 from a direction perpendicular to the plane is larger than an area obtained by projecting the circuit board 3 onto a plane parallel to the bottom plate of the second enclosure 2. In other words, the area occupied by the circuit board 3 in the first enclosure 1 is larger than the area occupied in the second enclosure 2. The integrated circuit element 4 is disposed in a region of the circuit board 3 accommodated in the first enclosure 1.

The heat transfer portion 5 can be formed using various kinds of materials in a form of a grease, a gel, and a sheet. A grease heat transfer material is generally used, and examples of this type of heat transfer material include a thermosetting resin having adhesiveness and a semi-cured resin having low elasticity. The resin constituting the heat transfer portion 5 contains a filler formed of metal, carbon, ceramic, or the like and having good thermal conductivity. The heat transfer portion 5 is preferably a semi-cured resin including a silicon-based resin containing a ceramic filler, for example, which has flexibility deformable with respect to deformation and vibration due to heat of the circuit board 3 and tolerance at the time of manufacturing.

The heat dissipating shield member 6 is formed of a plate-like metal member having excellent thermal conductivity and electric conductivity, such as aluminum or copper. The heat dissipating shield member 6 may have a structure in which carbon such as graphene or a graphite sheet is attached to a metal member. In addition, the heat dissipating shield member 6 can improve heat dissipation performance by including a material excellent in heat transport using a phase change technique such as a heat pipe or a vapor chamber.

As illustrated in FIG. 4, the heat dissipating shield member 6 includes an inner portion 6a accommodated in the first enclosure 1, and an outer portion 6b connected to the inner portion 6a and extending to the outside of the first enclosure 1 via the communication opening 12. Although not illustrated, a sealing material may be provided in the communication opening 12, and the enclosure 10 and the heat dissipating shield member 6 make the inside watertight. When with the enclosure 10 and the heat dissipating shield member 6, the inside of the enclosure is watertight, it is possible to achieve waterproofness by using the heat dissipating shield member 6 having a shielding effect, and it is not necessary to add a member for waterproofing.

As described above, the communication opening 12 is formed by the rectangular cutout recess 12-1 at the rear portion of the first enclosure 1 and the rectangular cutout recess 12-2 at the front portion of the second enclosure 2. The rectangular cutout recess 12-1 provided in the first enclosure 1 constitutes an opening at the rear portion of the communication opening 12.

The inner portion 6a and the outer portion 6b of the heat dissipating shield member 6 can be integrally formed by sheet metal processing, in other words, can be formed as one member. In addition, it can be integrally formed by casting using a metal material such as aluminum. In addition, the inner portion 6a and the outer portion 6b may be formed as separate members and integrated by welding, fastening, or the like to form the heat dissipating shield member 6.

The inner portion 6a of the heat dissipating shield member 6 has a flat portion 31 substantially parallel to the circuit board 3 and a shield portion 32 bent substantially perpendicularly to the flat portion 31. The flat portion 31 has a belt-like shape larger than the lengths of the integrated circuit element 4 in the left-right direction (longitudinal direction) and the front-rear direction. In other words, when the integrated circuit element 4 is projected onto the flat portion 31, its shadow is formed inside the contour of the flat portion 31. The flat portion 31 includes a thermal coupling portion 31a (see FIG. 2) thermally coupled to the integrated circuit element 4 via the heat transfer portion 5.

The inner portion 6a of the heat dissipating shield member 6 is thermally coupled to the integrated circuit element 4 via the heat transfer portion 5 inside the first enclosure 1, and has a belt-like shape with a large surface area. Therefore, it has a diffusion function of spreading heat released from the integrated circuit element 4 into the first enclosure 1. The inner portion 6a of the heat dissipating shield member 6 can also be thermally coupled to other heat generating components (not illustrated) mounted on the circuit board 3 via the heat transfer portion 5.

As illustrated in FIG. 2, the shield portion 32 of the inner portion 6a of the heat dissipating shield member 6 extends toward the circuit board 3. As illustrated in FIG. 3, the shield portion 32 extends over the entire region facing the connector 7 and the Ethernet terminal 8 in the left-right direction (longitudinal direction). As illustrated in FIGS. 2 and 4, the distal end portion 33 of the shield portion 32 is bent at a substantially right angle. As illustrated in FIG. 2, a gasket 21 is interposed between the distal end portion 33 of the shield portion 32 and the circuit board 3.

The gasket 21 is a member having a conductive layer around thereof with a core material of polyurethane, rubber, or the like. The gasket 21 is electrically connected to a ground portion (not illustrated) provided on the circuit board 3. Therefore, the heat dissipating shield member 6 is connected to the ground portion via the gasket 21.

As illustrated in FIG. 3, both end portions of the shield portion 32 of the inner portion 6a of the heat dissipating shield member 6 in the left-right direction (longitudinal direction) are each inserted into the communication opening 12 formed in the abutting portion between the first enclosure 1 and the second enclosure 2 and are exposed to the outside. Then, the shield portion 32 is bent at a right angle toward the rear portion at a position where both end portions of the shield portion 32 are each exposed to the outside, and is connected to the outer portion 6b. A pair of outer portions 6b of the heat dissipating shield member 6 is provided at both ends of the shield portion 32 of the inner portion 6a in the left-right direction (longitudinal direction). The length of the outer portion 6b in the height direction (direction from the bottom portion toward the ceiling portion of the first enclosure) is substantially the same as the length of the shield portion 32 in the height direction, and has a belt-like shape with a large surface area. The area of the outer portion 6b of the heat dissipating shield member 6 is larger than the area of the communication opening 12 provided in the enclosure 10.

The area of the communication opening 12 is formed to be substantially equal to or slightly larger than the cross-sectional area of the shield portion 32 having a substantially rectangular cross section and inserted into the communication opening 12, and there is almost no gap between the communication opening 12 and the shield portion 32. Both end faces of the communication opening 12 may be brought into contact with the shield portion 32. As described above, in order to make the inside of the enclosure watertight, a watertight functional member may be provided in the communication opening 12.

The heat generated from the integrated circuit element 4 is transferred from the inner portion 6a to the outer portion 6b via the shield portion 32. Then, the heat is dissipated from the outer portion 6b into the air by convection and radiation. The outer portion 6b has a large area of a belt-like shape extending along the left and right side portions of the first enclosure 1. Therefore, according to the present embodiment, it is possible to increase the heat dissipation performance by the heat dissipating shield member 6. The outer portion 6b can have a heat dissipation fin, and with such a structure, the heat dissipation performance can be further improved.

The heat dissipating shield member 6 is formed of a plate-shaped conductive member, and the cross-sectional area of the shield portion 32 inserted into the communication opening 12 is small. The first enclosure 1 and the second enclosure 2 constituting the enclosure 10 have conductivity. A gap is hardly formed between the shield portion 32 and the communication opening 12. Further, the entire assembly opening 11 provided in the abutting portion between the first enclosure 1 and the second enclosure 2 is closed by the second enclosure 2, in other words, covered, and no gap is formed in the enclosure 10 except for the gap between the shield portion 32 and the communication opening 12.

Therefore, it is possible to suppress electromagnetic radiation in which electromagnetic noise from the integrated circuit element 4 and the like is radiated to the outside of the enclosure 10 and electromagnetic noise intruding into the enclosure 10 from the outside through the gap between the shield portion 32 and the communication opening 12.

In the above description, the communication opening 12 has been exemplified as a structure formed by an opening provided in each of the first enclosure 1 and the second enclosure 2, but the communication opening 12 may be formed by an opening provided in one of the first enclosure 1 and the second enclosure 2.

The outer portion 6b may be fixed to the side portion of the first enclosure 1 using a fastening member (not illustrated) such as a screw. In addition, the outer portion 6b of the heat dissipating shield member 6 may be provided with an attachment portion 34 (see FIG. 4) to be attached to an external device such as a vehicle body of a vehicle. Although not illustrated, the attachment portion 34 may be provided with a female screw portion to which a fastening member such as a bolt is fastened and a through hole through which the fastening member is inserted.

As illustrated in FIGS. 2 and 3, the shield portion 32 of the heat dissipating shield member 6 is disposed between the integrated circuit element 4, and the connector 7 and the Ethernet terminal 8. Therefore, a wall that blocks electromagnetic noise radiated from the integrated circuit element 4 is formed. Therefore, electromagnetic noise intruding from between the opening of the second enclosure 2, and the connector 7 and each Ethernet terminal 8 is blocked by the shield portion 32 of the heat dissipating shield member 6, and can be prevented from leaking to the integrated circuit element 4. In addition, the electromagnetic noise radiated from the integrated circuit element 4 is blocked by the shield portion 32 of the heat dissipating shield member 6, and it is possible to prevent the leakage electromagnetic noise from being radiated to the outside via the connection member connected to each Ethernet terminal 8.

As illustrated in FIG. 2, the shield portion 32 of the heat dissipating shield member 6 is positioned closer to the second enclosure 2 than the communication opening 12 (In FIG. 2, the communication opening 12 is indicated by a two-dot chain line). That is, the shield portion 32 of the heat dissipating shield member 6 is disposed at a face identical to or closer to the connector 7 and the Ethernet terminal 8 than the end portion 12a, of the communication opening 12, toward the second enclosure 2.

Therefore, electromagnetic noise intruding from the outside of the enclosure 10 through the communication opening 12 is blocked by the shield portion 32. As a result, the effect of preventing leakage of electromagnetic noise to each Ethernet terminal 8 can be further improved.

As described above, the shield portion 32 of the heat dissipating shield member 6 is electrically connected to the ground portion (not illustrated) of the circuit board 3 via the gasket 21. Since the electromagnetic noise is AC, the impedance connecting the shield portion 32 and the ground portion is considered to be sufficiently small with respect to the frequency of the electromagnetic noise to be blocked. In such a structure, a loop serving as a noise transmission path is formed between the integrated circuit element 4, the heat transfer portion 5, the flat portion 31 of the heat dissipating shield member 6, the shield portion 32, the gasket 21, and the ground portion of the circuit board 3, and leakage of electromagnetic noise to the connector 7 and each Ethernet terminal 8 can be suppressed.

As described above, by electrically connecting the heat dissipating shield member 6 to the ground portion provided on the circuit board 3, the shielding effect of the electromagnetic noise can be further improved.

In the above embodiment, the distal end portion 33 of the shield portion 32 that presses the gasket 21 against the circuit board 3 is bent at substantially a right angle with respect to the shield portion 32. However, the distal end portion 33 of the shield portion 32 may have a straight shape that extends the shield portion 32 as it is without being bent.

In addition, the shield portion 32 of the heat dissipating shield member 6 is connected to the circuit board 3 via the gasket 21 in a thermally conductive manner at a position away from the integrated circuit element 4. Therefore, the heat generated from the integrated circuit element 4 is dispersed in a wide region of the circuit board 3 by the inner portion 6a of the heat dissipating shield member 6, and local concentration of heat can be suppressed.

The gasket 21 interposed between the circuit board 3 and the shield portion 32 of the heat dissipating shield member 6 has a structure in which a flexible member such as polyurethane or rubber is used as a core material. Therefore, it is possible to reduce the stress acting on the integrated circuit element 4 due to deformation or vibration of the circuit board 3 due to heat, tolerance during manufacturing, or application of an external force to the outer portion 6b.

In the above embodiment, the second enclosure 2 has the internal space for accommodating the terminals such as the connector 7 and the Ethernet terminal 8, but the electronic control device 100 of the present invention can also be applied to a structure not including the connector 7 and the Ethernet terminal 8. The second enclosure 2 may have a plate-like lid structure as long as the second enclosure 2 does not have the connector 7 or the Ethernet terminal 8, and only a decorative panel or the like is attached to the second enclosure 2, for example.

According to the first embodiment of the present invention, the following effects are obtained.

(1) The electronic control device 100 includes the enclosure 10 including the first enclosure 1 having the assembly opening 11 and the second enclosure 2 covering the entire assembly opening 11 and having the communication opening 12 communicating with the assembly opening 11, the circuit board 3 accommodated in the enclosure 10, the integrated circuit element 4 mounted on the circuit board 3, and the heat dissipating shield member 6 that is thermally coupled to the integrated circuit element 4 and grounded. The heat dissipating shield member 6 has the inner portion 6a that is accommodated in the enclosure 10 and has thermally coupled to the integrated circuit element 4 and the outer portion 6b extending to the outside of the enclosure 10 via the communication opening 12. The entire assembly opening 11 provided in the first enclosure 1 is covered with the second enclosure 2. The heat dissipating shield member 6 has the outer portion 6b extending to the outside of the enclosure 10 via the communication opening 12 communicating with the assembly opening 11. Since the heat generated from the integrated circuit element 4 is dissipated from the outer portion 6b of the heat dissipating shield member 6 into the air by convection and radiation, the heat dissipating shield member 6 has efficient heat dissipation performance. In addition, in the enclosure 10, no gap is formed other than the gap between the heat dissipating shield member 6 and the communication opening 12, and there is almost no gap between the heat dissipating shield member 6 and the communication opening 12. Therefore, it is possible to suppress electromagnetic radiation in which electromagnetic noise from the integrated circuit element 4 is radiated to the outside of the enclosure 10 and electromagnetic noise intruding into the enclosure 10 from the outside through the gap between the heat dissipating shield member 6 and the communication opening 12.

(2) The heat dissipating shield member 6 having the inner portion 6a and the outer portion 6b is formed of a metal member as one member. Therefore, the cost can be reduced as compared with a heat dissipation member or the like having a heat dissipation fin.

(3) The enclosure 10 has a pair of side portions each having a communication opening 12 communicating with the assembly opening 11, and the heat dissipating shield member 6 has a pair of outer portions 6b each extending from the communication opening 12 to the outside of the enclosure 10. By providing the outer portion 6b on both side portions of the enclosure 10, the area of the outer portion 6b can be increased, and the heat dissipation performance can be improved.

(4) The Ethernet terminal 8 connected to the circuit board 3 is further provided, and the Ethernet terminal 8 includes the shield portion 32 in which the inner portion 6a of the heat dissipating shield member 6 is electrically connected to a ground portion provided on the circuit board 3 between the integrated circuit element 4 and the Ethernet terminal 8. In such a structure, a loop serving as a noise transmission path is formed between the integrated circuit element 4, the heat dissipating shield member 6, and the ground portion of the circuit board 3, and leakage of electromagnetic noise to the Ethernet terminal 8 can be suppressed. Therefore, electromagnetic noise intruding from the outside through the opening of the second enclosure 2 to which the Ethernet terminal 8 is attached is blocked by the shield portion 32 of the heat dissipating shield member 6, and leakage of the electromagnetic noise to the integrated circuit element 4 can be prevented.

(5) The gasket 21 having flexibility and electrically connecting the shield portion 32 and the ground portion of the circuit board 3 is further provided between the shield portion 32 of the heat dissipating shield member 6 and the ground portion of the circuit board 3. Therefore, it is possible to reduce the stress acting on the integrated circuit element 4 due to deformation or vibration of the circuit board 3 due to heat, tolerance during manufacturing, or application of an external force to the outer portion 6b.

(6) The shield portion 32 of the heat dissipating shield member 6 is disposed on a line identical to the end portion 12a, of the communication opening 12, toward the Ethernet terminal 8, or is disposed closer to the Ethernet terminal 8 side than the end portion 12a, of the communication opening 12, toward the Ethernet terminal 8. As a result, the electromagnetic noise intruding from the outside of the enclosure 10 through the communication opening 12 is blocked by the shield portion 32, and the effect of preventing leakage of the electromagnetic noise to the Ethernet terminal 8 can be improved.

Second Embodiment

Figure 5:
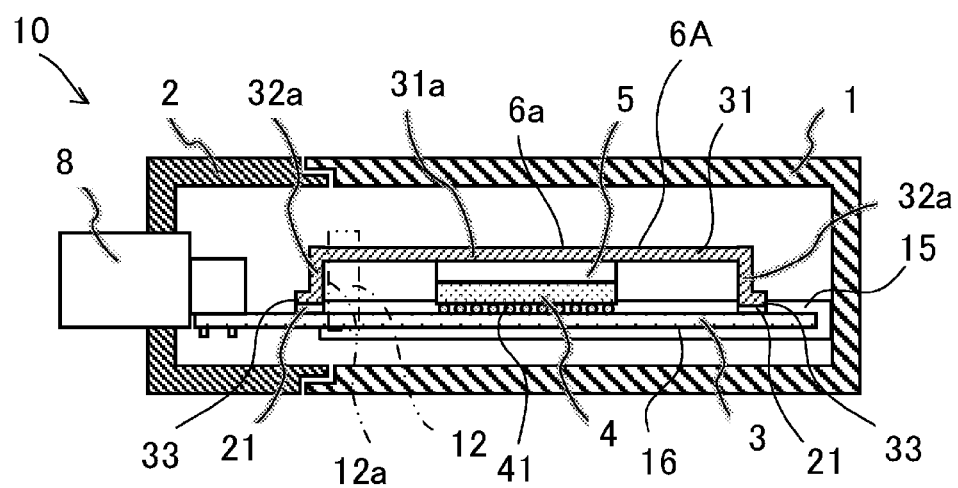
FIG. 5 is a cross-sectional view illustrating a second embodiment of the electronic control device of the present invention.

FIG. 5 is a cross-sectional view illustrating a second embodiment of the electronic control device of the present invention. FIG. 5 is a diagram corresponding to FIG. 2 of the first embodiment.

The electronic control device 100 of the second embodiment is different from that of the first embodiment in that the entire outer peripheral side face of the integrated circuit element 4 is surrounded by a shield portion 32a of a heat dissipating shield member 6A.

As illustrated in FIG. 5, the heat dissipating shield member 6A includes the shield portion 32a provided on a front portion, a rear portion, and a pair of side portions (not illustrated in FIG. 5) connecting the front portion and the rear portion of the flat portion 31. That is, the shield portion 32a of the heat dissipating shield member 6A is formed in a rectangular shape in plan view surrounding the outer periphery of the inner portion 6a. Therefore, the entire outer peripheral side face of the integrated circuit element 4 is surrounded by the shield portion 32a of the heat dissipating shield member 6A.

The gasket 21 is provided between the pair of front and rear shield portions 32a of the inner portion 6a of the heat dissipating shield member 6A and the ground portion of the circuit board 3.

Other structures of the electronic control device 100 of the second embodiment are similar to those of the first embodiment, and corresponding members are denoted by the same reference numerals, and description thereof is omitted.

The electronic control device 100 of the second embodiment includes all the members of the first embodiment including the heat dissipating shield member 6 of the first embodiment.

Therefore, the electronic control device 100 of the second embodiment has the same effects (1) to (6) as that of the first embodiment.

In addition, in the second embodiment, the shield portion 32a of the heat dissipating shield member 6A surrounds the entire outer peripheral side face of the integrated circuit element 4. Therefore, the wraparound of the electromagnetic noise intruding from the gap between the opening of the second enclosure 2 and the connector 7 and each Ethernet terminal 8 can be suppressed, and the effect of blocking the leakage electromagnetic noise is further exerted. In addition, since the heat generated from the integrated circuit element 4 is transferred to the circuit board 3 via the shield portions 32a and 32b on both the front and rear sides, the heat diffusion effect can be further increased.

In the above description, the shield portion 32a of the heat dissipating shield member 6A has been exemplified as a structure surrounding the entire outer peripheral side face of the integrated circuit element 4. However, the shield portion 32a of the heat dissipating shield member 6A may have a structure formed only corresponding to the front and rear side faces of the integrated circuit element 4, or a structure formed corresponding to the front portion and the pair of side faces of the integrated circuit element 4.

Third Embodiment

Figure 6:
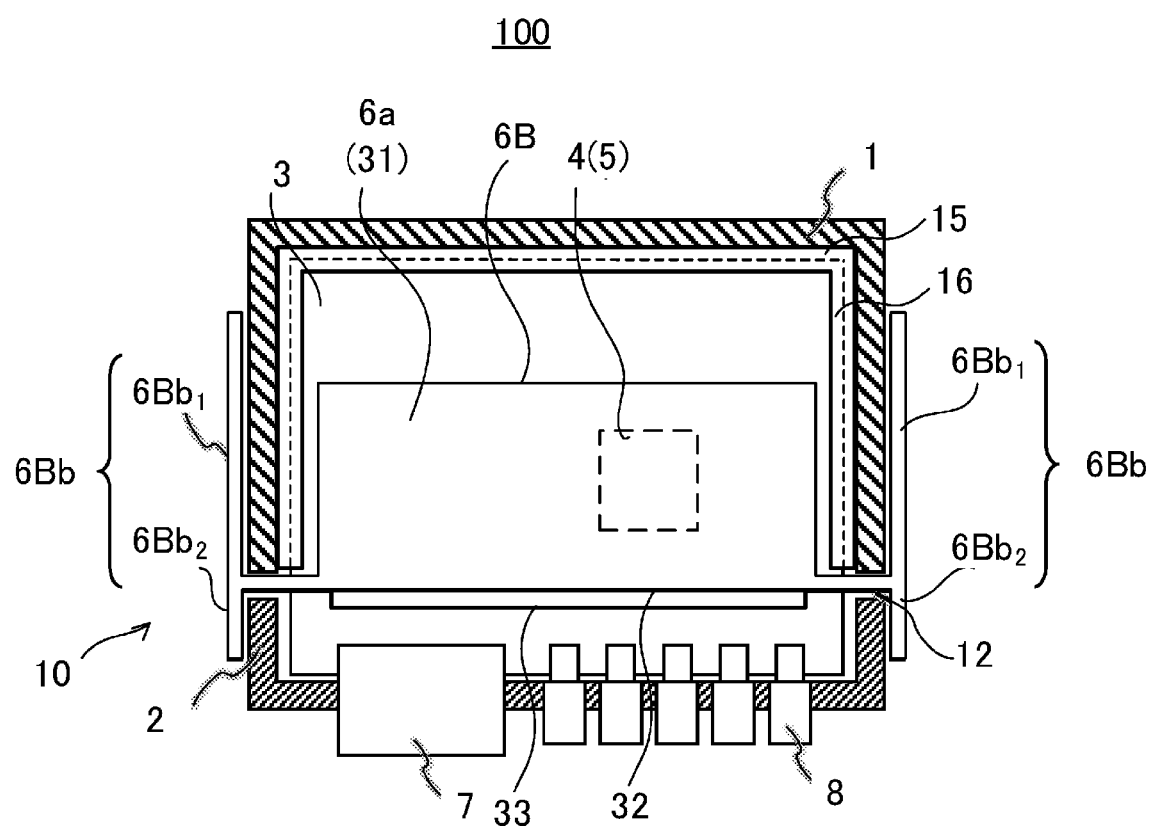
FIG. 6 is a cross-sectional view illustrating a third embodiment of the electronic control device of the present invention.

FIG. 6 is a cross-sectional view illustrating a third embodiment of the electronic control device of the present invention. FIG. 6 is a diagram corresponding to FIG. 3 of the first embodiment.

In the electronic control device 100 of the first embodiment, the outer portion 6b of the heat dissipating shield member 6 has a structure extending to the rear side along the side portion of the first enclosure 1. On the other hand, in the electronic control device 100 of the second embodiment, the outer portion 6Bb of the heat dissipating shield member 6B has an outer rear portion 6Bb1 and an outer front portion 6Bb2 extending to the front side and the rear side, respectively, along the side portions of the first enclosure 1 and the second enclosure 2.

As illustrated in FIG. 6, as in the first embodiment, a heat dissipating shield member 6B has a pair of outer portions 6Bb1 and 6Bb2 provided at each of both ends in the left-right direction (longitudinal direction). The outer portion 6Bb1 extends from the shield portion 32 of the heat dissipating shield member 6 to the rear side along the side portion of the first enclosure 1, and the outer front portion 6Bb2 extends to the front side along the side portion of the second enclosure 2.

As a result, the surface area of the heat dissipating shield member 6B can be made larger than that of the first embodiment. Furthermore, it is possible to suppress intrusion and radiation of electromagnetic noise from the communication opening 12.

Other structures of the electronic control device 100 of the third embodiment are similar to those of the first embodiment, and corresponding members are denoted by the same reference numerals, and description thereof is omitted.

The electronic control device 100 of the third embodiment is different from the heat dissipating shield member 6 of the first embodiment in the following points. In the first embodiment, the outer portion 6b extends only to the rear side of the first enclosure 1. On the other hand, in the electronic control device 100 of the third embodiment, the heat dissipating shield member 6B of the third embodiment includes the outer rear portion 6Bb1 and the outer front portion 6Bb2 extending to the rear side of the first enclosure 1 and the front side of the second enclosure 2, respectively. Therefore, the electronic control device 100 of the third embodiment includes all the members of the first embodiment.

Therefore, the electronic control device 100 of the third embodiment has the same effects (1) to (6) as that of the first embodiment.

In addition, in the third embodiment, since the surface area of the outer portion 6Bb of the heat dissipating shield member 6B is increased by the amount of the outer portion 6Bb extending to the front side of the second enclosure 2, it is possible to further increase the heat dissipation performance. Furthermore, it is possible to suppress intrusion and radiation of electromagnetic noise from the communication opening 12.

In the first embodiment, it is described that the attachment portion 34 to be attached to an external device such as a vehicle body of a vehicle can be provided on the outer portion 6b of the heat dissipating shield member 6. In the third embodiment, the attachment portion 34 can be provided on the portion 6Bb2 extending to the front side of the outer portion 6Bb. That is, the attachment portion 34 may be provided on either the portion 6Bb1 extending to the rear portion of the outer portion 6Bb or the portion 6Bb2 extending to the front portion. In addition, the attachment portion 34 can be provided on both of the portion 6Bb1 extending to the rear portion of the outer portion 6Bb and the portion 6Bb2 extending to the front portion. In this way, the attachment strength of the electronic control device 100 is increased, and the attachment portions 34 are provided at four locations, so that the attachment structure is stabilized and the reliability against vibration and impact is also improved.

Fourth Embodiment

Figure 7:
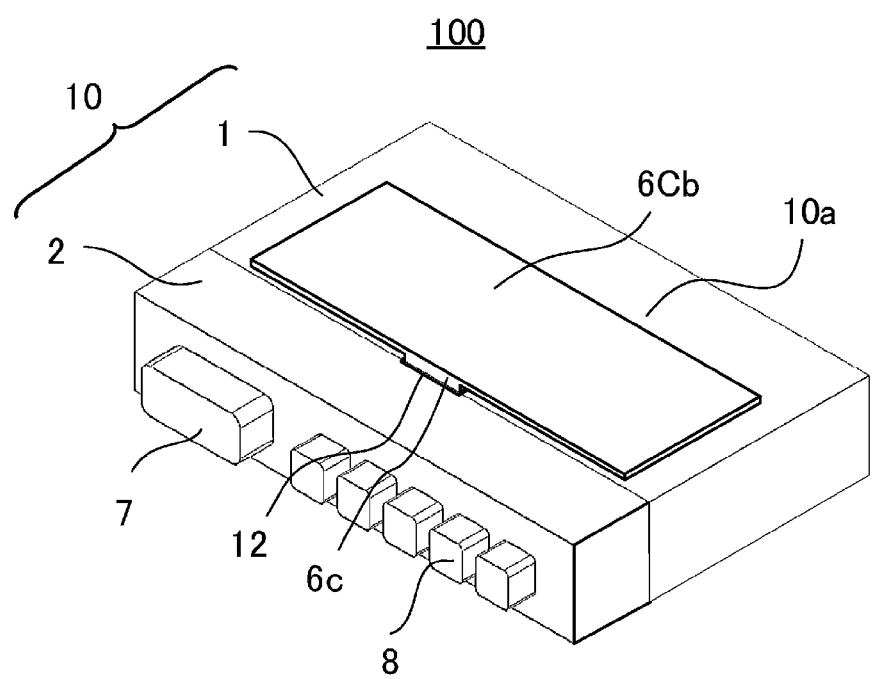
FIG. 7 is an external perspective view illustrating a fourth embodiment of the electronic control device of the present invention.

FIG. 7 is a diagram illustrating a fourth embodiment of the electronic control device of the present invention.

In the first embodiment, the outer portion 6b of the heat dissipating shield member 6 is drawn out to the outside at both end portions of the enclosure 10 in the left-right direction (longitudinal direction). On the other hand, in the electronic control device according to the fourth embodiment, an outer portion 6Cb of the heat dissipating shield member (not illustrated) is drawn to the outside from the ceiling portion 10a of the enclosure 10.

As illustrated in FIG. 7, the communication opening 12 is provided across the abutting portion between the ceiling portion of the first enclosure 1 and the ceiling portion of the second enclosure 2, and the outer portion 6Cb of the heat dissipating shield member is drawn out from the communication opening 12 to the outside. The outer portion 6Cb of the heat dissipating shield member has a coupling portion 6c connected to the inner portion 6a (see FIGS. 2 to 4 and the like) provided inside the enclosure 10. The coupling portion 6c is formed to be narrow to be inserted into the communication opening 12, and is bent at a substantially right angle upward (toward the ceiling portion) from the flat portion 31.

The outer portion 6Cb is connected to the coupling portion 6c, and is bent at substantially a right angle with respect to the coupling portion 6c and extends along the ceiling portion of the first enclosure 1. The outer portion 6Cb has a large area slightly smaller than the ceiling portion of the first enclosure 1, and has a belt-like shape with a large heat dissipation area.

Other structures of the electronic control device 100 of the fourth embodiment are similar to those of the first embodiment, and corresponding members are denoted by the same reference numerals, and description thereof is omitted.

In the electronic control device 100 of the fourth embodiment, the arrangement of the outer portion 6Cb of the heat dissipating shield member is merely changed from a location of each of both end portions in the left-right direction (longitudinal direction) of the first embodiment to a location of the ceiling portion, and other structures are the same as those of the first embodiment.

Therefore, the electronic control device 100 of the fourth embodiment has the same effects (1) to (6) as that of the first embodiment.

In the fourth embodiment, the outer portion 6Cb of the heat dissipating shield member may also be provided on the bottom portion of the first enclosure 1. As in the third embodiment, the outer portion 6Cb of the heat dissipating shield member may have a structure including a portion extending toward the rear portion along the ceiling portion of the first enclosure and a portion extending toward the front portion along the ceiling portion of the second enclosure 2.

Fifth Embodiment

Figure 8:
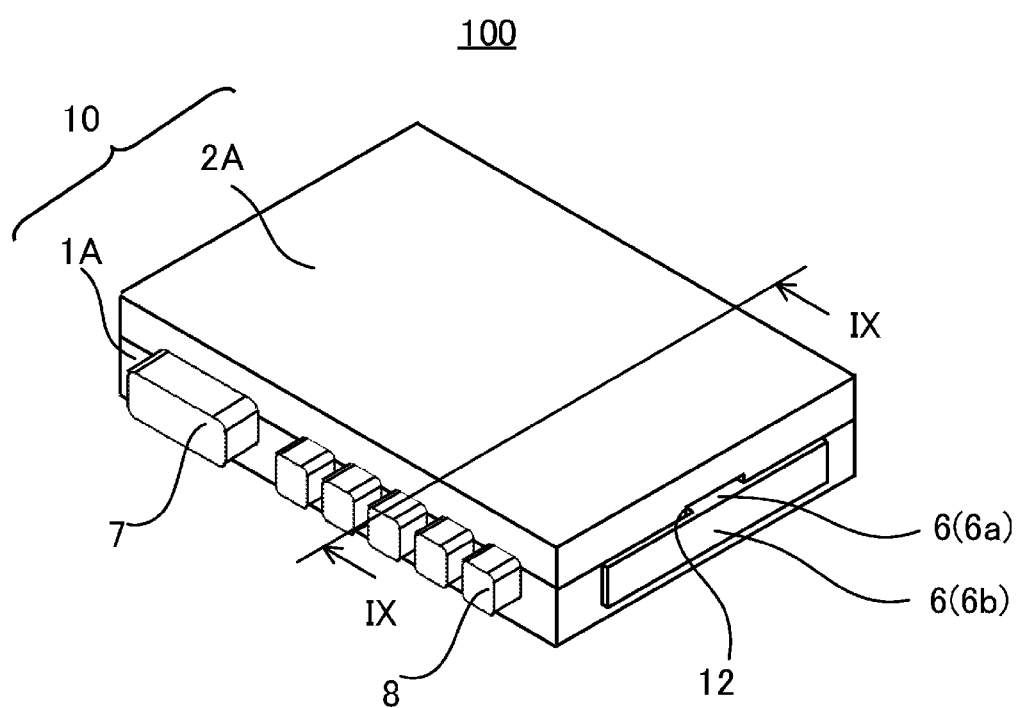
FIG. 8 is an external perspective view illustrating a fifth embodiment of the electronic control device of the present invention.
Figure 9:
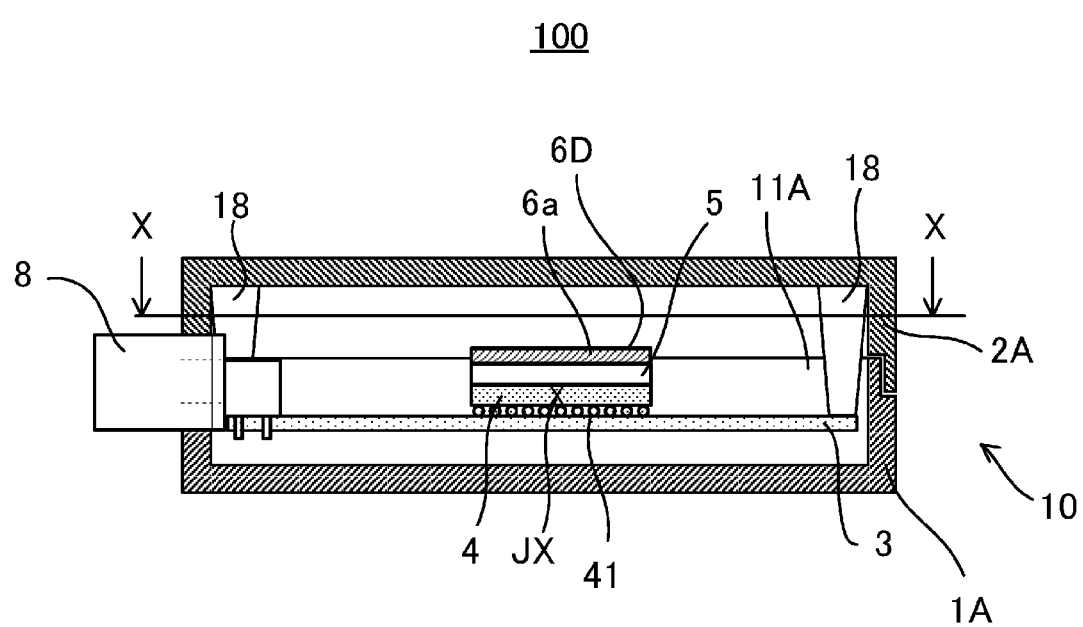
FIG. 9 is a cross-sectional view of the electronic control device illustrated in FIG. 8 taken along line IX-IX.
Figure 10:
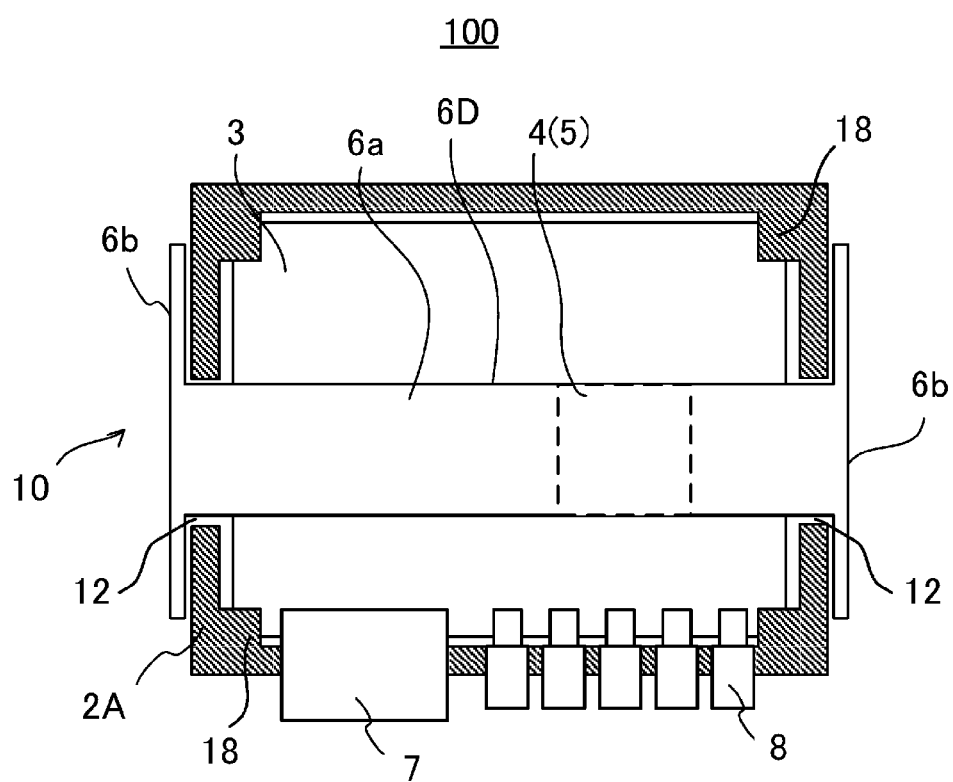
FIG. 10 is a cross-sectional view of the electronic control device illustrated in FIG. 9 taken along line X-X.

FIG. 8 is an external perspective view illustrating a fifth embodiment of the electronic control device of the present invention, FIG. 9 is a cross-sectional view of the electronic control device illustrated in FIG. 8 taken along line IX-IX, and FIG. 10 is a cross-sectional view of the electronic control device illustrated in FIG. 9 taken along line X-X.

The enclosure 10 of the electronic control device 100 according to the first to fourth embodiments has a structure in which the first enclosure 1 and the second enclosure 2 are disposed on the same layer, that is, on the same plane and assembled. On the other hand, the enclosure 10 of the electronic control device 100 according to the fifth embodiment has a structure in which a first enclosure 1A and a second enclosure 2A are stacked and assembled. In the first to fourth embodiments, the circuit board 3 is fitted into the groove 16 of the board guide portion 15, but in the fifth embodiment, the circuit board 3 is fixed to a boss portion 18 provided in the second enclosure 2A by a fastening member such as a screw.

Hereinafter, a structure different from that of the first embodiment will be mainly described, and description of the same structure as that of the first embodiment will be appropriately omitted.

The electronic control device 100 includes the enclosure 10 including the first enclosure 1A and the second enclosure 2A, a heat dissipating shield member 6D, the circuit board 3, the integrated circuit element 4, the connector 7, and the plurality of Ethernet terminals 8. As illustrated in FIG. 8, the first enclosure 1A and the second enclosure 2A are stacked and disposed. The first enclosure 1A is formed in a box shape having an assembly opening 11A (see FIG. 9) at the upper portion. In addition, the second enclosure 2A is formed in a box shape having an opening, facing the assembly opening 11A, of a size same as that of the assembly opening 11A at the lower portion. As illustrated in FIGS. 8 and 9, the first enclosure 1A and the second enclosure 2A are assembled by stacking a peripheral edge portion of the assembly opening 11A of the first enclosure 1A and a peripheral edge portion of the opening of the second enclosure 2A.

The enclosure 10 accommodates the circuit board 3 and the integrated circuit element 4. The connector 7 and the plurality of Ethernet terminals 8 are mounted on the circuit board 3 by soldering. The connector 7 and the plurality of Ethernet terminals 8 are inserted into an opening formed in the first enclosure 1A and protrude to the outside of the enclosure 10 in a state of being mounted on the circuit board 3.

The heat dissipating shield member 6D is disposed on the integrated circuit element 4. The heat transfer portion 5 for improving heat conduction between the integrated circuit element 4 and the heat dissipating shield member 6D is interposed between the heat dissipating shield member 6D and the integrated circuit element 4.

As illustrated in FIGS. 9 and 10, the boss portion 18 extending from each of the four corner portions toward the circuit board 3 is integrally formed in the second enclosure 2A. The circuit board 3 is fixed to the boss portion 18 using a fastening member (not illustrated) such as a screw. In the above embodiment, the boss portion 18 is exemplified as provided in the second enclosure 2A, but the boss portion 18 may be provided in the first enclosure 1A.

The communication opening 12 opened to the outside is provided on each of both side portions of the first enclosure 1A and the second enclosure 2A in the left-right direction (longitudinal direction). The communication opening 12 communicates with the assembly opening 11A.

The integrated circuit element 4 and the heat dissipating shield member 6D are mounted on the circuit board 3. As illustrated in FIG. 9, the heat dissipating shield member 6D includes the inner portion 6a accommodated in the first enclosure 1A, and the outer portion 6b connected to the inner portion 6a and extending to the outside of the first enclosure 1A via the communication opening 12.

As illustrated in FIG. 10, the inner portion 6a of the heat dissipating shield member 6D has a belt-like shape in which the length (width) in the front-rear direction is substantially the same as that of the integrated circuit element 4 and the inner portion 6a extends in the left-right direction (longitudinal direction) with the same width. The inner portion 6a of the heat dissipating shield member 6D is connected to the outer portion 6b at a position exposed from the communication opening 12. The outer portion 6b of the heat dissipating shield member 6D is bent at a substantially right angle toward the bottom portion of the first enclosure 1A with respect to the inner portion 6a, and extends in the front-rear direction along the side portion of the first enclosure 1A. The outer portion 6b has a length (width) in the front-rear direction larger than that of the inner portion 6a, and has a large area.

The heat dissipating shield member 6D of the electronic control device 100 of the fifth embodiment does not include the shield portion 32 provided in the first embodiment and disposed between the Ethernet terminal 8 and the integrated circuit element 4, so that the structure is simplified and the cost can be reduced.

Other structures of the electronic control device 100 of the fifth embodiment are similar to those of the first embodiment.

The electronic control device 100 according to the fifth embodiment includes the enclosure 10 including the first enclosure 1A having the assembly opening 11A and the second enclosure 2A covering the entire assembly opening 11A and having the communication opening 12 communicating with the assembly opening 11A, the circuit board 3 accommodated in the enclosure 10, the integrated circuit element 4 mounted on the circuit board 3, and the heat dissipating shield member 6D thermally coupled to the integrated circuit element 4. Therefore, the same effect as the effect (1) of the first embodiment is obtained.

As in the first embodiment, in the fifth embodiment, the heat dissipating shield member 6D can be formed as one member by a metal member. The outer portion 6b of the heat dissipating shield member 6D extends from the communication opening 12 communicating with the assembly opening 11A to the outside of the enclosure 10. Furthermore, as in the first embodiment, in the fifth embodiment, the inner portion 6a of the heat dissipating shield member 6D has a structure in which the shield portion 32 electrically connected to a ground portion provided on the circuit board 3 is included between the integrated circuit element 4 and the connector 7. In addition, the gasket 21 having flexibility and electrically connecting the shield portion 32 and the ground portion of the circuit board 3 is provided between the shield portion 32 of the heat dissipating shield member 6D and the ground portion of the circuit board 3.

Therefore, the fifth embodiment also has the same effects (1) to (5) of the first embodiment.

EXAMPLE

The electronic control device 100 described as the fifth embodiment was produced using the following members.

The outer shape of the enclosure 10 was 176 mm×117 mm×28 mm (thickness). The circuit board 3 was fixed to boss portions (not shown) provided at four corner portions of the first enclosure 1A using screws (not shown). The first enclosure 1A and the second enclosure 2A were produced using a PBT resin having a thermal conductivity of 0.8 W/mK and an emissivity of 0.9.

The integrated circuit element 4 was formed as a flip chip ball grid array (FCBGA) type semiconductor device of 30 mm×30 mm×3.2 mm (thickness) and mounted on the circuit board 3.

The circuit board 3 was formed of an FR4 material having a size of 158 mm×104 mm×1.6 mm (thickness). The circuit board 3 is an 8-layer multilayer board, and has an equivalent thermal conductivity of 69.4 W/mK in the in-plane direction and 0.45 W/mK in the vertical direction.

The connector 7 and the plurality of Ethernet terminals 8 were mounted on the circuit board 3.

The heat transfer portion 5 was formed of a low-elastic heat transfer material having a thermal conductivity of 2 W/mK and containing a thermally conductive filler in a silicon-based resin. The heat transfer portion 5 was provided on the integrated circuit element 4 and had a size of 30 mm×30 mm×1.9 mm (thickness).

The heat dissipating shield member 6D was formed of an aluminum material having a thermal conductivity of 240 W/mK. The inner portion 6a had a width of 30 mm and a thickness of 2 mm, and was provided on the upper portion of the heat transfer portion 5 on the integrated circuit element 4. The outer portion 6b had a length of 107 mm, a width of 10 mm, and a thickness of 2 mm, and was connected to the outer face of the first enclosure 1A.

A comparative product was prepared for comparison with the example of the present invention.

In the electronic control device 100 having the structure shown in FIGS. 8 to 10, the comparative product has a structure in which the heat dissipating shield member 6D is not provided and the communication opening 12 is not formed in the first enclosure 1A and the second enclosure 2A. The first enclosure 1A and the second enclosure 2A was formed of PBT resin having the same thermal conductivity and emissivity as those of the example. On the integrated circuit element 4, the heat transfer portion 5 formed of the same material as in the example was provided with the same thickness of 1.9 mm as in the example.

Since the comparative product did not have the heat dissipating shield member 6D, the heat transfer portion 5 was brought into direct contact with the ceiling portion of the second enclosure 2A. However, the height of the internal space of the first enclosure 1A (the length from the inner face of the bottom portion to the inner face of the ceiling portion) was the same as that in the example, and the boss portion corresponding to the thickness of the heat dissipating shield member 6D of the example was provided on the ceiling portion of the second enclosure 2A. That is, the lower face side of the heat transfer portion 5 is in contact with the integrated circuit element 4, and the upper face of the heat transfer portion 5 is in contact with the lower face of the boss portion provided on the ceiling portion of the second enclosure 2A.

In order to check the heat dissipation effect according to the embodiment of the present invention, junction temperatures of the integrated circuit elements 4 of the example and the comparative product were measured. The junction temperature is a surface temperature of a semiconductor chip constituting the integrated circuit element 4, and is measured at the outer peripheral side face JX of the integrated circuit element 4 illustrated in FIG. 9. The junction temperature was measured under a condition in which the calorific value of the integrated circuit element 4 was 5.1 W in a windless environment and an environmental temperature of 75° C.

Figure 11:
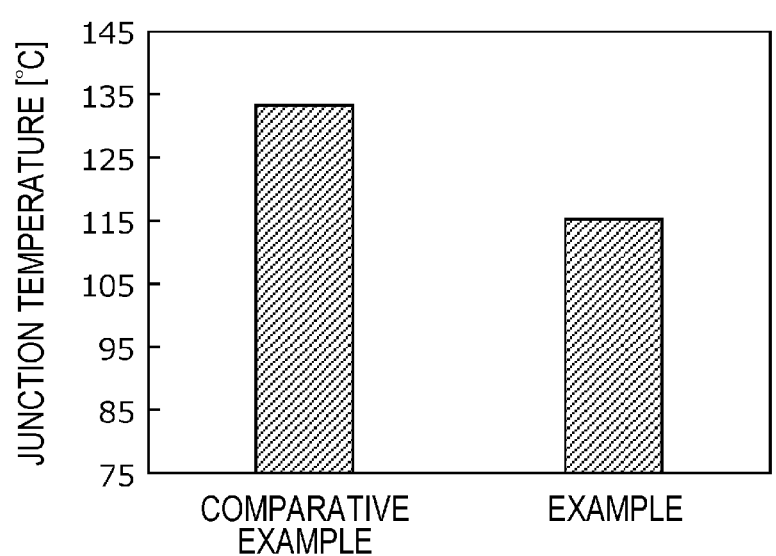
FIG. 11 is a diagram illustrating junction temperatures of the example and the comparative examples of the present invention.

FIG. 11 is a diagram illustrating junction temperatures of the example of the present invention and the comparative example.

As shown in FIG. 11, it was confirmed that the junction temperature under the above conditions in the example was lower than that in the comparative example by about 18° C. As a result, it was confirmed that the electronic control device 100 according to the example of the present invention has compatibility between the shielding property of the electromagnetic noise and the heat dissipation performance property.

In each of the above embodiments, the integrated circuit element 4 is exemplified as an FCBGA type semiconductor device. However, the integrated circuit element 4 may be a BGA type other than the FCBGA type. The integrated circuit element 4 may be an electronic component other than the BGA type.

In each of the above embodiments, the structure in which the heat transfer portion 5 is interposed between the heat dissipating shield member 6, 6A, 6B, 6C, 6D and the integrated circuit element 4 has been exemplified. However, it is sufficient that the integrated circuit element 4 and the heat dissipating shield member 6, 6A, 6B, 6C, 6D have a thermal coupling structure capable of favorable heat conduction, and the heat transfer portion 5 may be omitted.

The structures, materials, shapes, and the like of the heat dissipating shield member 6, 6A, 6B, 6C, 6D described in the above embodiments are exemplified as an example, and are appropriately changed and applied depending on various factors such as the internal structure of the enclosure 10 and electronic components accommodated in the enclosure 10.

Although various embodiments and modifications have been described above, the present invention is not limited to these contents. The embodiments may be combined or modified as appropriate. Other aspects conceivable within the scope of the technical idea of the present invention are also included within the scope of the present invention.

The disclosure of the following priority application is incorporated herein by reference.

Japanese Patent Application No. 2020-8785 (filed on Jan. 22, 2020)

REFERENCE SIGNS LIST 1, 1A first enclosure
2, 2A second enclosure
3 circuit board
4 integrated circuit element
6, 6A, 6B, 6C, 6D heat dissipating shield member
6a inner portion
6b, 6Bb, 6Cb outer portion
7 connector
8 Ethernet terminal
10 enclosure
11, 11A assembly opening
12 communication opening
12a end portion
16 groove
21 gasket
31 flat portion
32, 32a, 32b shield portion
34 attachment portion
100 electronic control device

The invention claimed is:

1. An electronic control device comprising:
an enclosure including a first enclosure having an assembly opening and a second enclosure covering the entire assembly opening, the enclosure having a communication opening communicating with the assembly opening;
a circuit board accommodated in the enclosure;
an integrated circuit element mounted on the circuit board; and
a heat dissipating shield member thermally coupled to the integrated circuit element and grounded,
wherein
the heat dissipating shield member includes
an inner portion accommodated inside the enclosure and thermally coupled to the integrated circuit element and
an outer portion extending to an outside of the enclosure via the communication opening.

2. The electronic control device according to claim 1, wherein the heat dissipating shield member including the inner portion and the outer portion is formed of a metal member as one member.

3. The electronic control device according to claim 1, wherein
the enclosure has a pair of side portions each having the communication opening communicating with the assembly opening, and
the heat dissipating shield member has a pair of the outer portions each extending from the communication opening to an outside of the enclosure.

4. The electronic control device according to claim 1, further comprising:
a connector connected to the circuit board, wherein
the connector is exposed to an outside through an opening provided in the enclosure, and
the inner portion of the heat dissipating shield member includes a shield portion electrically connected to a ground portion provided on the circuit board between the integrated circuit element and the connector.

5. The electronic control device according to claim 4, further comprising:
a gasket having flexibility and electrically connecting the shield portion and the ground portion of the circuit board between the shield portion of the heat dissipating shield member and the ground portion of the circuit board.

6. The electronic control device according to claim 5, wherein
an area obtained by projecting the circuit board on a plane parallel to a bottom face of the first enclosure from a direction perpendicular to the plane is larger than an area obtained by projecting the circuit board on a plane parallel to a bottom face of the second enclosure, and
an area occupied by the circuit board in the first enclosure is larger than an area occupied by the circuit board in the second enclosure, and
the connector is provided in the second enclosure.

7. The electronic control device according to claim 5, wherein the connector is fixed to the second enclosure, and at least part of the circuit board is fitted into a groove provided in the first enclosure.

8. The electronic control device according to claim 5, wherein the shield portion of the heat dissipating shield member is disposed on a line identical to an end portion, of the communication opening, toward the connector, or disposed closer to the connector than an end portion, of the communication opening, toward the connector.

9. The electronic control device according to claim 1, wherein an area of the heat dissipating shield member is larger than an area of the communication opening provided in the enclosure.

10. The electronic control device according to claim 1, wherein the first enclosure is formed of resin containing metal or a conductive filler, or a material containing metal.

11. The electronic control device according to claim 1, wherein the second enclosure is formed of resin containing metal or a conductive filler, or a material containing metal.

12. The electronic control device according to claim 1, wherein the outer portion of the heat dissipating shield member includes an attachment portion attached to a vehicle.

\* \* \* \* \*